United States Patent
Niwa et al.

(10) Patent No.: US 7,639,756 B2
(45) Date of Patent: Dec. 29, 2009

(54) APPARATUS AND METHOD FOR ADJUSTING QUADRATURE MODULATOR, COMMUNICATION APPARATUS AND PROGRAM

(75) Inventors: Satoshi Niwa, Tokyo (JP); Kazuo Ogoro, Tokyo (JP)

(73) Assignee: NEC Corporation, Tokyo (JP)

( * ) Notice: Subject to any disclaimer, the term of this patent is extended or adjusted under 35 U.S.C. 154(b) by 798 days.

(21) Appl. No.: 11/044,035

(22) Filed: Jan. 28, 2005

(65) Prior Publication Data

US 2005/0169402 A1 Aug. 4, 2005

(30) Foreign Application Priority Data

Jan. 30, 2004 (JP) .............................. 2004-024034

(51) Int. Cl.
    *H04L 27/36* (2006.01)
(52) U.S. Cl. ...................... 375/298; 375/301
(58) Field of Classification Search ................ 375/298, 375/306, 307, 308, 301
    See application file for complete search history.

(56) References Cited

U.S. PATENT DOCUMENTS

| 5,119,399 | A  | * | 6/1992 | Santos et al. ................. 375/224 |
| 6,570,933 | B1 | * | 5/2003 | Makinen ...................... 375/296 |
| 7,068,983 | B2 | * | 6/2006 | Kanazawa et al. ........... 455/123 |
| 2002/0191713 | A1 | * | 12/2002 | McVey ........................ 375/308 |
| 2003/0231075 | A1 | * | 12/2003 | Heiskala et al. .............. 332/103 |
| 2004/0132424 | A1 | * | 7/2004 | Aytur et al. .................. 455/335 |
| 2004/0146118 | A1 | * | 7/2004 | Talwalkar et al. ........... 375/298 |
| 2004/0230393 | A1 | * | 11/2004 | Andersson ................... 702/107 |
| 2004/0252782 | A1 | * | 12/2004 | Demir et al. ................. 375/296 |

FOREIGN PATENT DOCUMENTS

JP 2000-124964 4/2000

* cited by examiner

*Primary Examiner*—Emmanuel Bayard
(74) *Attorney, Agent, or Firm*—Dickstein Shapiro LLP

(57) ABSTRACT

Disclosed are an apparatus and a method for the adjustment time for IQ offset of a quadrature modulator of a transmission circuit. In adjusting the I-offset and the Q-offset of a quadrature modulator, supplied with an I-signal and a Q-signal output from an analog baseband unit to modulate a carrier. Set-up values of the I-offset and the Q-offset, associated with at least three different points on an IQ offset correction plane having an I-component and a Q-component as X- and Y-coordinates, are set for the analog baseband unit at respective different set-up timings. The values of the carrier leak level, associated with three-point offset set-up values of the output signal of the quadrature modulator, are acquired by a sole measurement operation. From the measured values of the three-point carrier leak levels, the values of the carrier suppression ratio for the three points are found from the measured values of the three points of the carrier leak level to find the optimum set-up values of the I-offset and the Q-offset.

19 Claims, 14 Drawing Sheets

ZERO-SPAN

APPARATUS AND METHOD FOR ADJUSTING QUADRATURE MODULATOR, COMMUNICATION APPARATUS AND PROGRAM

FIELD OF THE INVENTION

This invention relates to a modulator for a radio communication apparatus and, more particularly, to a circuit and a method for adjusting IQ offsets of a quadrature modulator of a transmission circuit.

BACKGROUND OF THE INVENTION

In a radio communication apparatus, such as a mobile phone terminal, a modulation system in which the communication information is mapped on a so-called I-Q plane of a carrier for modulation for e.g. QPSK (quadrature phase shift keying), p/4 shift QPSK, 8PSK or HPSK (hybrid phase shift keying), is widely used. In such mobile phone terminal, an I-signal and a Q-signal are generated in a baseband side circuit and modulated by the quadrature modulator to generate a wireless signal.

Meanwhile, if a d.c. component is left in the I-signal or in the Q-signal, output from the baseband side circuit, or in the I-input circuit or in the Q-input circuit on the quadrature modulator side circuit, carrier components are superposed on the modulated wireless signal, thus increasing the so-called origin offset to deteriorate modulation accuracy or to increase errors on a demodulator side. The d.c. offset component is subjected to variations from one device to another, such that offset component is not reduced to zero. In case the d.c. component is left in the IQ input circuit of the quadrature modulator, the d.c. component is superimposed on the IQ input, thus generating unneeded signal called 'carrier leak'. In case the carrier leak signal is larger than the signal component, the origin offset of the modulated output signal is increased to deteriorate the modulation accuracy (error vector magnitude: EVM) or to increase the demodulation error on the demodulator side. The offset component is subjected to variations from one device (e.g. a semiconductor device inclusive of the quadrature modulator) to another, such that the component is not reduced to zero. However, if the allowable offset value in e.g. a device is set to a smaller value, the production yield of the device is lowered due to offset by a test conducted at the time of manufacture.

Thus, in manufacturing a radio communication apparatus, it is necessary to provide a scheme of detecting and canceling out the residual offset component. This processing, termed 'IQ signal offset adjustment', is referred to as 'IQ offset adjustment' in the context of the present description. This processing is an indispensable process in the manufacture of a mobile phone terminal employing a quadrature modulator.

A typical example of the conventional IQ offset adjustment is now briefly explained. In the IQ offset adjustment, residual offsets of the I-signal and in the Q-signal are detected and intentionally applied as d.c. offset of the IQ signals to cancel out the residual offsets. Since the I-signal and the Q-signal are two-dimensional signals, it is difficult to adjust the I-signal and the Q-signal simultaneously. Hence, each of the I-signal and the Q-signal is adjusted at a time, by exploiting the orthogonality of I-signal and the Q-signal, in order to give an optimum offset cancellation value.

First, the I-offset is set to a certain fixed value, and the Q-offset is varied and several Q-offset values are measured to find the Q-offset value which will minimize the carrier leak. This Q-offset value is set as an optimum Q-side point. In similar manner, the Q-side offset is fixed at the optimum point thus found and the I-side offset is varied until such a point is found which will minimize the carrier leak. This point is set as an optimum I-side point.

The I-side is a gain fixed and the Q-side is changed to find an optimum point.

The above processing is repeated until the IQ offset value remains unchanged. This adjusts the IQ offset value.

This adjustment technique, which sequentially or empirically finds out the I-offset and the Q-offset, necessitates a large number of measurement and adjustment operations, whilst the time needed for adjusting a sole terminal (radio communication apparatus) is not unstable and becomes protracted.

The Patent Document 1, indicated below, discloses a configuration of arithmetically calculating the I-offset and the Q-offset to be corrected by measurement of several origin offset values. This method directly measures the origin offset value, instead of measuring the carrier offset value, such that one IQ offset pair needs to be set from time to time.

[Patent Document 1]
JP Patent Kokai Publication No. JP-P2000-124964A (pages 4 and 5, FIG. 4)

SUMMARY OF THE DISCLOSURE

The conventional IQ offset adjustment suffers from variations in the IQ offset from one device as a subject of adjustment to the next. Since the two-dimensional adjustment of the I-signal and the Q-signal is needed, skill on the part of the operator is required, while the processing time is protracted.

In determining the IQ offset value for correction, such an adjustment method is routinely used in which a d.c. offset is applied to the IQ signal a number of times to decrease the then prevailing carrier leak. This operation is time-consuming because of necessity of performing the large number of times of IQ offset setting and carrier leak measurement operations.

With the technique of the Patent Document 1, the number of times of the measurement operations is decreased, however, plural measurement and setting operations still need to be performed, such that adjustment is time-consuming. In mass-producing e.g. mobile phone terminals, such prolonged adjustment detracts from production efficiency to render it difficult to lower the production cost.

Accordingly, it is an object of the present invention to provide an apparatus and a method, and a computer program, by means of which the offset and/or the gain of the quadrature modulator of a transmission circuit may be adjusted to high accuracy, while the test cost is decreased, as the adjustment time is shortened appreciably.

It is another object of the present invention to provide an apparatus and a method, and a computer program, by means of which the margin of variations of the offset and/or the gain of the I-signal and the Q-signal of the quadrature modulator (device) may be enlarged to reduce the product cost.

The above and other objects are attained by a method in accordance with one aspect of the present invention, for deriving, by a computer, optimum adjustment values of an offset (I-offset) of an in-phase signal (I-signal) and an offset (Q-offset) of a quadrature signal (Q-signal) of a quadrature modulator, which is configured to quadrature modulate a carrier with the I-signal and with the Q-signal, output from a baseband unit, and for outputting the quadrature modulated carrier. The method comprises a step of inputting a measured value of a carrier leak level of an output of the quadrature modulator, which is supplied with the I-signal and the Q-signal, output from the baseband unit, for each of, preferably at least three, a plurality of respective different sets of set-up values of the I-offset and the Q-offset, as selected on a two-dimensional coordinate plane having I-components and Q-components as X and Y coordinates, and a step of finding corresponding values of a carrier suppression ratio from measured values of the carrier leak level of the sets of the set-up values of the I-offset and the Q-offset to derive optimum adjustment values of the I-offset and the Q-offset.

With the method of the present invention, the optimum adjustment value of the I-offset and the Q-offset may also be deduced by finding the signal output level, from the absolute values of the carrier leak level associated with the three sets of the I-offset and the Q-offset, without directly measuring the signal output level, and by finding the values of the carrier suppression ratio for the respective sets.

The method of the present invention includes a step of finding the corresponding carrier suppression ratio from the measured values of the carrier suppression level for at least three sets, and finding, from the carrier suppression ratio, the distance up to an optimum adjustment point of the I-offset and the Q-offset on the two-dimensional coordinate plane, and a step of finding a point of intersection of three circles, having the set-up values of the I-offset and the Q-offset as centers and having the distances up to the optimum adjustment point as radii, on the two-dimensional coordinate plane, to find an optimum value of the I-offset and the Q-offset.

The present invention also provides, in another aspect, a method for adjusting, on a computer, an offset (I-offset) of an in-phase signal (I-signal) and an offset (Q-offset) of a quadrature signal (Q-signal) of a quadrature modulator, configured to quadrature modulate a carrier with the I-signal and with the Q-signal, output from a baseband unit. The method comprises (a) a step of the computer setting, for the baseband unit, set-up values of the I-offset and the Q-offset, associated with at least three respective different sets of the I-offset and the Q-offset, on a two-dimensional coordinate plane, having the I-signal and the Q-signal as X and Y coordinates, at respective different set-up timings, (b) a step of a measurement device acquiring three carrier leak levels, associated with at least three sets of the set-up values of the I-offset and the Q-offset, from an output signal of the quadrature modulator associated with the three sets of the set-up values of the I-offset and the Q-offset, by at least one measurement, and (c) a step of the computer finding the values of a carrier suppression ratio from the measured values of the carrier leak level associated with the three sets of the I-offset and the Q-offset as measured by the measurement device to derive the optimum adjustment values of I and Q-offsets. The method may also comprise (d) a step of the computer setting optimum adjustment values of the I-offset and the Q-offset derived in the baseband unit, and (e) a step of the computer terminating the adjustment in case the value of the carrier leak after setting the optimum adjustment values of the I-offset and the Q-offset in case the baseband unit is less than a specified value and of the computer proceeding to the processing of the step (a) to set another set of the I-offset and the Q-offset in the baseband unit in case the baseband unit is not less than the specified value.

The present invention also provides, in another aspect, a method for adjusting, on a computer, the gain of an in-phase signal (I-signal) and the gain of a quadrature signal (Q-signal) of a quadrature modulator configured to quadrature modulate a carrier with the I-signal and with the Q-signal, output from a baseband unit, and for outputting the quadrature modulated carrier. The method comprises (a) a step of the computer setting, for the baseband unit, at least one set of set-up values of the gain of the I-signal and the Q-signal, (b) a step of a measurement device measuring a signal output level and a side-band leak, from an output signal of the quadrature modulator, supplied with the I-signal and with the Q-signal output from the baseband unit at the gain setting, and (c) a step of the computer deriving an image suppression ratio for the gain from the signal output level and the side-band leak as measured by the measurement device to derive optimum values of the I-gain and the Q-gain from the image suppression ratio on a two-dimensional coordinate plane having an I-component and a Q-component as X-coordinate and Y-coordinate. The method may further comprise (d) a step of the computer setting optimum adjustment values of the I-gain and the Q-gain deduced, in the baseband unit, and (e) a step of the computer terminating the adjustment in case the value of the image suppression level after setting the optimum adjustment values of the I-gain and the Q-gain in the baseband unit is less than a specified value, and the computer proceeding to the processing of the step (a) to set another set of the I-gain and the Q-gain in the baseband unit in case the value of the image suppression level is not less than the specified value.

The present invention also provides, in still another aspect, an offset adjustment device for adjusting the I-offset and the Q-offset of a communication apparatus comprising a baseband unit for outputting an in-phase signal (I-signal) and a quadrature signal (Q-signal); and a quadrature modulator which includes: a phase shifter for phase shifting a carrier by 90°; first and second mixer receiving the I-signal and the Q-signal output from said baseband unit respectively and multiplying the I-signal and the Q-signal with said carrier and with an output of said phase shifter respectively; and an adder for summing the results of multiplication of said first and second mixers to output an output signal. The device comprises a measurement unit, and a data processing unit for controlling the measurement unit and the communication apparatus. The data processing unit includes means for setting, for the baseband unit of the communication apparatus, at least three respective different sets of set-up values of the I-offset and the Q-offset, on a two-dimensional coordinate plane having the I-component and the Q-component as X-coordinate and Y-coordinates, at respective different set-up timings. The measurement unit acquires carrier leak levels associated with the three sets of offset set-up values, by one measurement from an output signal of the quadrature modulator. The data processing unit is supplied with measured values of three sets of the carrier leak level obtained by the measurement unit to find three sets of the carrier suppression ratio to find optimum adjustment values of the I-offset and the Q-offset.

According to the present invention, frequency sweeping of a frequency analyzer, forming a measurement device supplied with an output signal from the quadrature modulator, is not performed, the center frequency is fixed at the carrier leak frequency, and measurement is carried out at a fixed tuning mode. A plural number of carrier leak levels, associated with the respective offset set-up values, are acquired by one measurement operation.

The present invention also provides, in still another aspect, a program for executing, on a computer for adjusting an offset in an I-signal (I-offset) and an offset in a Q-signal (Q-offset) of a quadrature signal (Q-signal) of a quadrature modulator configured to quadrature modulate a carrier with the I-signal and with the Q-signal, output from a baseband unit, and for outputting the quadrature modulated carrier, the processing of setting, on the baseband unit, at least three sets of respective different set-up values of the I-offset and the Q-offset, as selected on a two-dimensional coordinate plane having an I-component and a Q-component as X and Y coordinates, the processing of reading out measured values of a measurement device configured for measuring the carrier leak level output from the quadrature modulator supplied with the I-signal and with the Q-signal output from the baseband unit where the three sets of the set-up values of the I-offset and the Q-offset are set, and the processing of finding corresponding values of the carrier suppression ratio from the measured values of the carrier leak level associated with the three sets of the I-offset and the Q-offset to deduce optimum adjustment values of the I-offset and the Q-offset.

The present invention also provides, in still another aspect, a communication apparatus comprising a baseband unit for outputting an in-phase signal (I-signal) and a quadrature signal (Q-signal); and a quadrature modulator which includes: a phase shifter for phase shifting a carrier by 90°; first and second mixer receiving the I-signal and the Q-signal output from said baseband unit respectively and multiplying the I-signal and the Q-signal with said carrier and with an output of said phase shifter respectively; and an adder for summing the results of multiplication of said first and second mixers to output an output signal. The apparatus comprises means for storing, as I-offset and Q-offset, set for the baseband unit, at least three sets of set-up values of the I-offset and the Q-offset, at respective predetermined set-up timings, on a two-dimensional coordinate plane having an I-component and a Q-component as X and Y coordinates. During offset adjustment, three sets of values of the carrier suppression ratio are found from measured values of the carrier leak level associated with the three sets of set-up values of the I-offset and the Q-offset, from the output signal of the quadrature modulator, to set the I-offset and the Q-offset derived on the baseband unit. The baseband unit corrects the offset of the input I-signal and the input Q-signal of the quadrature modulator by the set-up values of the I-offset and the Q-offset.

The present invention also provides, in still another aspect, a communication apparatus comprising a baseband unit for outputting an in-phase signal (I-signal) and a quadrature signal (Q-signal); and a quadrature modulator which includes: a phase shifter for phase shifting a carrier by 90°; first and second mixer receiving the I-signal and the Q-signal output from said baseband unit respectively and multiplying the I-signal and the Q-signal with said carrier and with an output of said phase shifter respectively; and an adder for summing the results of multiplication of said first and second mixers to output an output signal. The apparatus also comprises means for storing at least one set of gain set-up values of the I-signal and the Q-signal, as an I-gain and a Q-gain set for the baseband unit. During gain adjustment, optimum values of the I-gain and the Q-gain, deduced from the image suppression ratio as obtained from measured results of the signal output level and the side-band leak level associated with the gain set-up values from the quadrature modulator, are set in the baseband unit. The baseband unit corrects the gain of the I-signal and the Q-signal, input to the quadrature modulator, by the gain set-up values of I-gain and the Q-gain.

The meritorious effects of the present invention are summarized as follows.

According to the present invention, the IQ offsets may be adjusted reliably, without dependency on the residual offset of the quadrature modulator employing the initial state of e.g. a mobile terminal, thereby simplifying the adjustment operations for e.g. the mobile terminal to improve the productivity.

According to the present invention, the tolerance for manufacture of a device forming the quadrature modulator may be enlarged, with advantage for mass production, thereby enabling a more inexpensive device to be used.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
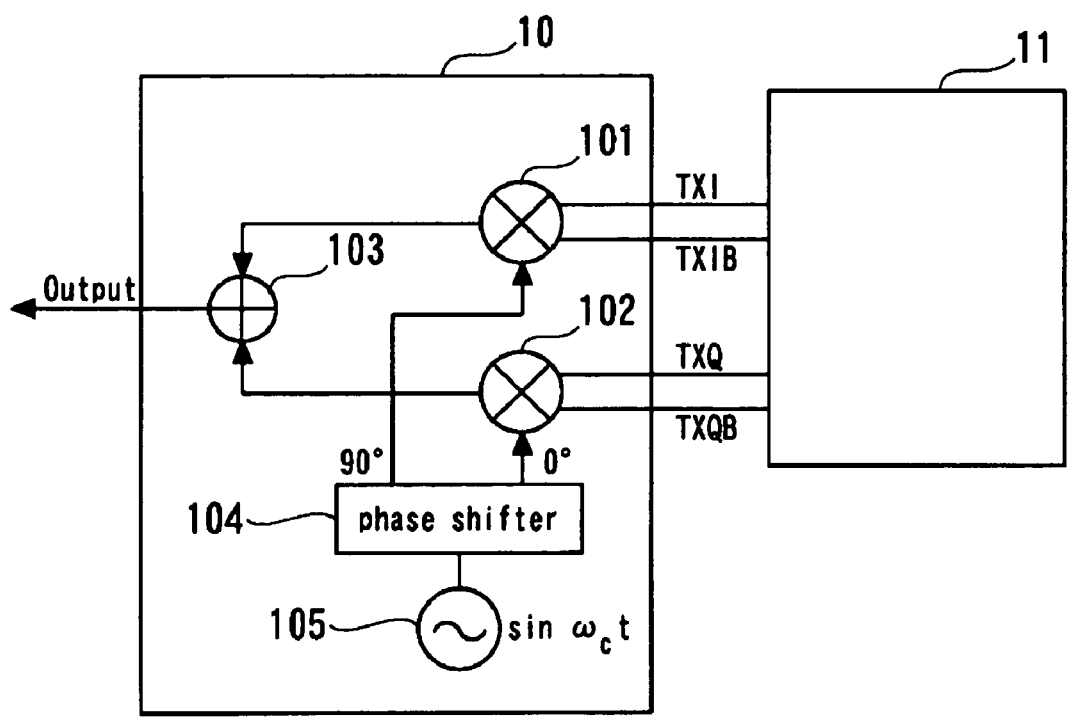
FIG. 1 is a diagram showing a configuration of an embodiment of the present invention.

Referring to the drawings, the present invention will be explained in further detail.

FIG. 1 shows the configuration of an embodiment of the present invention. Specifically, FIG. 1 shows a connection configuration between a quadrature modulation (MOD) unit 10 and an analog baseband unit (ABB) 11, outputting an in-phase signal (I signal) and a quadrature signal (Q signal), in a transmission circuit of a radio communication system. It is noted that TXI, TXIB, TXQ and TXQB, as IQ signals, are coupled across the quadrature modulator 10 and the analog baseband unit 11 of the transmission circuit. The signals TXI and TXQ are differential signals, such that there are non-inverted signals I, Q and inverted signals IB, QB on the I and Q terminals, respectively. It is noted that TX in TXI, TXB denotes 'transmission'.

The quadrature modulation (MOD) unit 10 includes mixers (multipliers) 101 and 102, an adder 103 for summing outputs of the mixers (multipliers) 101 and 102, a local oscillator 105 for generating a carrier, and a phase shifter 104 for supplying a carrier (sine wave) from the local oscillator 105 and a signal corresponding to the carrier phase-shifted by 900, to the mixers 102 and 101, respectively. The mixer 101 is differentially supplied with complementary I-components TXI and TXIB from the analog baseband unit 11 for multiplying the resulting signal with the carrier phase-shifted by 90°. The mixer 102 is differentially supplied with complementary Q-components TXQ and TXQB for multiplying the resulting signal with the carrier phase-shifted by 90°. The carrier from the local oscillator 105 may be supplied in a differential mode to the mixer. As the mixer, a well-known Gilbert multiplier, for example, may be used. In FIG. 1, the carrier is represented by a sine wave $\sin(\omega_c t)$. If the carrier is to be represented by a cosine wave $\cos(\omega_c t)$, the carrier and the signal $\sin(\omega_c t)$ which is orthogonal to the carrier and which is output from the phase shifter 104 by phase-shifting the carrier by 90°, are provided to the mixers 101 and 102, respectively.

Figure 2:
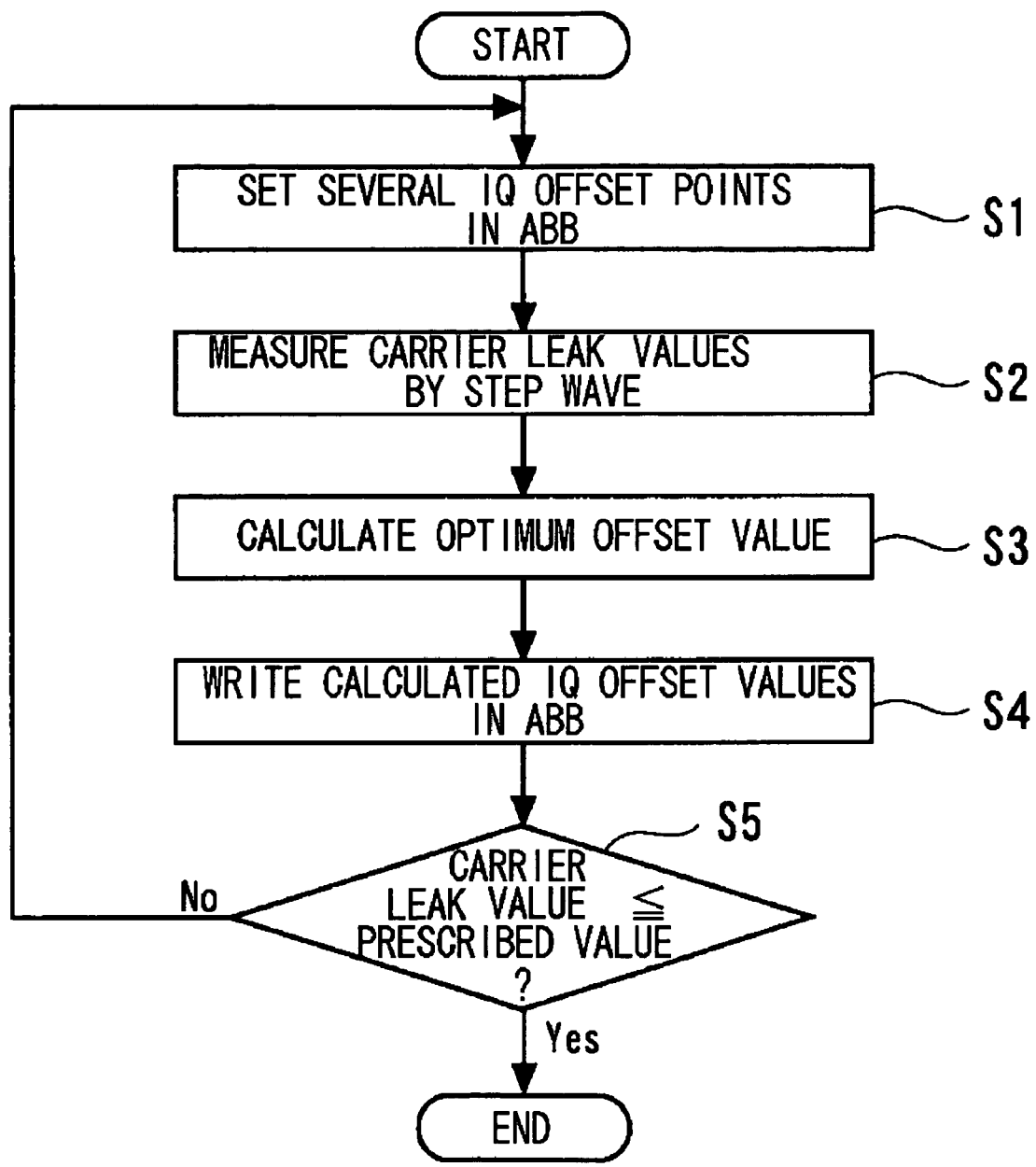
FIG. 2 shows a processing sequence of offset adjustment according to the embodiment of the present invention.

It is necessary to detect d.c. offset components, generated in the analog baseband unit 11, as an output side of the IQ signal, and in the quadrature modulator 10, as an input side of the IQ signals, to cancel out the IQ offset values. FIG. 2 depicts a flowchart showing the sequence of operations for adjusting the IQ offset in an embodiment of the present invention. In the present embodiment, the IQ offset is adjusted in accordance with the sequence of operations shown in FIG. 2.

In a step S1, several IQ offset points are set for the analog baseband unit 11. In the analog baseband unit 11, there is built-in a circuit for variably setting the set-up values of the TXIQ offset gain values, at each preset constant time interval, so that I and Q signals, reflecting the IQ offset values at each preset time interval, are output.

In the next step, the carrier leak value of the output of the quadrature modulator is measured by a measurement device. That is, the carrier leak value, corresponding to the IQ offset value, changed from time to time, is measured by one measurement operation, preferably in a zero span mode of a spectrum analyzer. The technique for measuring the carrier leak value, associated with the IQ offset value at each preset timing interval, represents one of the features of the present invention, and will be explained later.

In the next step S3, an optimum offset quantity is calculated by a computer, such as a personal computer. More specifically, an optimum IQ offset value is deduced from the carrier leak value measured using a preset algorithm used for calculating the d.c. offsets of I and Q. The deduction of the optimum I-offset value and Q-offset value represents one of the features of the present invention, and will be explained later.

In the next step S4, the so deduced I and Q offset values are set in the analog baseband unit 11. The transmission circuit includes a storage circuit for storing I and Q offset values, An output circuit for I and Q signals of the analog baseband unit 11 is designed to change the DC offset values based on the so set I and Q offset values.

In the next step S5, it is checked whether or not the carrier leak value at the calculated optimum I and Q offset values is equal to or less than a prescribed value. If the carrier leak value is equal to or less than the prescribed value, adjustment comes to a close. If the carrier leak value is larger than the prescribed value, processing reverts to the step S1. In the step S1, another set of set-up values of the I-offset and the Q-offset is set in the analog baseband unit 11. In case it is verified that the carrier leak value at the so calculated optimum I and Q offset set-up values is equal or less than the prescribed value, the set-up value of the optimum I and Q offset is stored in the analog baseband unit 11. The set-up value of the optimum I and Q offset may be recorded in an EEPROM (electrically rewritable ROM) of the radio communication apparatus. Meanwhile, it is possible to variably set the prescribed value used in the step S5.

In the present embodiment, the IQ offset adjustment may be carried out promptly, usually by one measurement operation, in accordance with the following procedure.

In the present embodiment, the distance up to the target of IQ adjustment may be obtained from the carrier leak ratio, as will now be described.

Figure 3:
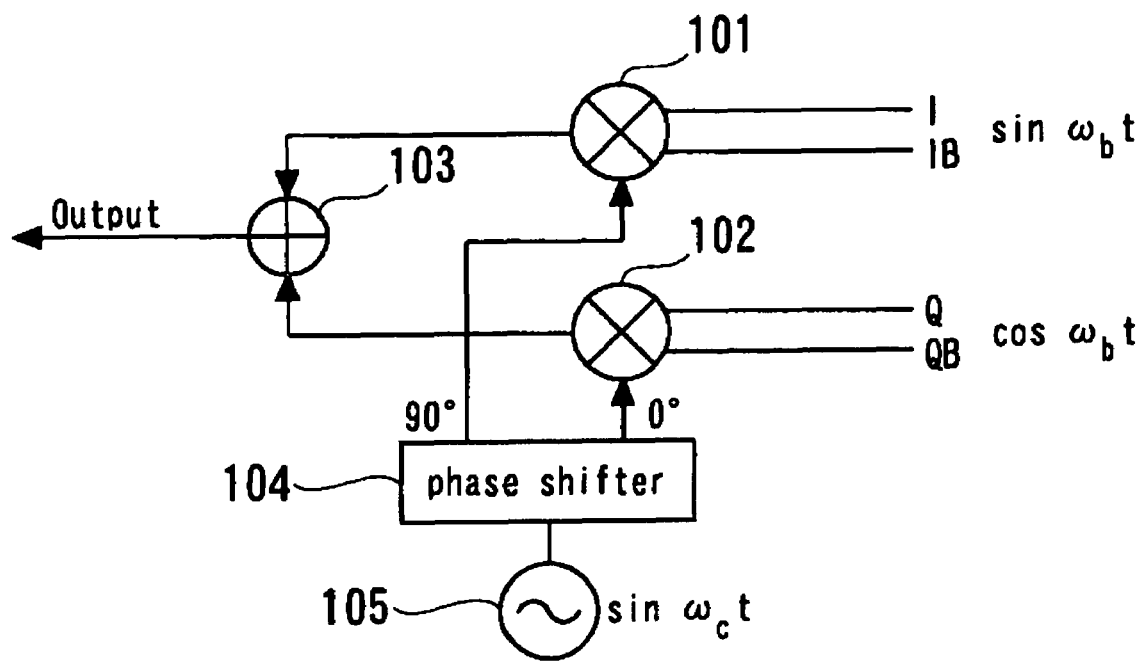
FIG. 3 illustrates the embodiment of the present invention.

The present embodiment is hereinafter explained by referring to the configuration of the quadrature modulator shown in FIG. 3. If a sum of the input residual offset values of the quadrature modulator and the variations of the d.c. offset of the analog baseband unit of the previous stage is generated across inputs I-IB and Q-QB of the quadrature modulator 10, and is applied as a dc offset component to an input, there is produced origin offset on the IQ signal plane, thus occasionally deteriorating the EVM. Consequently, this offset is directly summed in a negative fashion to cancel out the d.c. offset.

The present invention is now explained with reference to a preferred embodiment thereof.

If, in the quadrature modulator, d.c. offset (C, D) is superposed on the I and Q signals, an output $P_{out}$ may, for example, be represented by the following equation (1):

$$P_{out} = G\{(Ak\sin\omega_b t + C)\cos\omega_c t + (Bk\cos\omega_b t + D)\sin\omega_c t\} \quad (1)$$

$$= G\{k(A\sin\omega_b t\cos\omega_c t + B\cos\omega_b t\sin\omega_c t) +$$

$$C\cos\omega_c t + D\sin\omega_c t\}$$

$$= G\{k(\frac{A}{2}(\sin(\omega_b + \omega_c)t + \sin(\omega_b - \omega_c)t) +$$

$$\frac{B}{2}(\sin(\omega_b + \omega_c)t - \sin(\omega_b - \omega_c)t)) +$$

$$C\cos\omega_c t + D\sin\omega_c t\}$$

$$= G\{\frac{k}{2}\{(A+B)\sin(\omega_b + \omega_c)t + (A-B)\sin(\omega_b - \omega_c)t\} +$$

$$C\cos\omega_c t + D\sin\omega_c t\}$$

In the above equation (1),

G: gain k: amplitude of the sine wave

A: amplitude of the I-signal

B: amplitude of the Q-signal

C: d.c. offset of the I-signal

D: d.c. offset of the Q-signal.

Meanwhile, the gain G represents the gain from an input stage up to the output of the quadrature modulator of FIG. 1.

Figure 4:
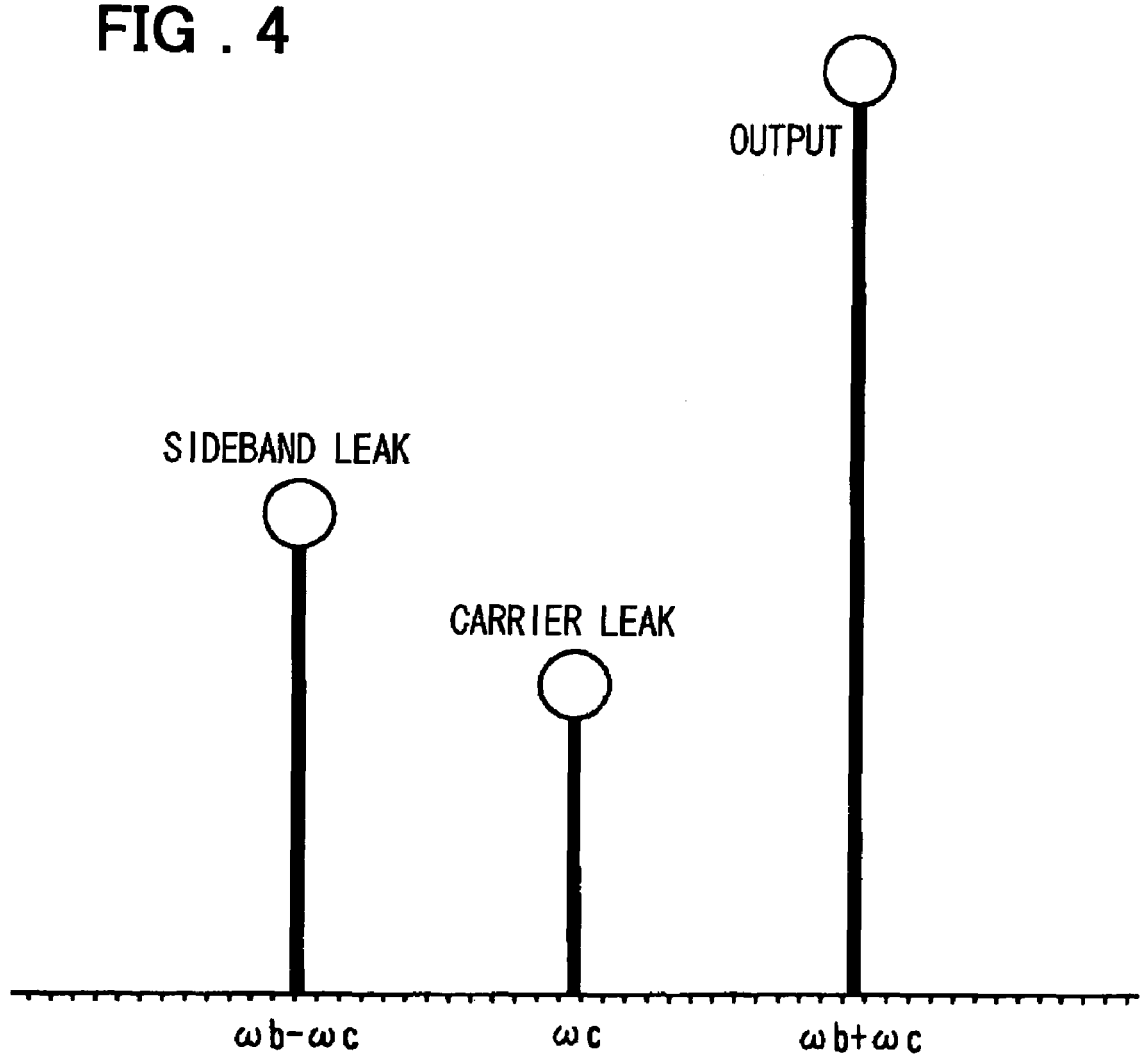
FIG. 4 illustrates the embodiment of the present invention.

FIG. 4 depicts the frequency components (spectrum) of the output signal $P_{out}$. In FIG. 4, the spectrum Output of the frequency ω b+ω c is a desired output signal. In the frequency components ω c and ω b−ω c, there are generated unneeded signal components (spectral components) called 'carrier leak' and 'side-band leak', respectively. It may be confirmed from the above equation (1) that these unneeded signal components are generated by the d.c. offset being superposed on I and Q inputs and by the gain unbalance of the I and Q signals.

The signal output level (Output level), side-band leak level and the carrier leak level may be found from the above equation (1) by the following equations (2), (3) and (4), respectively:

$$\text{Output level} = 20\log\frac{Gk(A+B)}{2} \quad (2)$$

$$\text{Carrierleak level} = 20\log G\sqrt{C^2+D^2} \quad (3)$$

$$\text{Carrierleak level} = 20\log G\sqrt{C^2+D^2} \quad (4)$$

The carrier suppression ratio (Carrier suppression), as a ratio of the carrier leak level to the signal output level (Output level), is represented by the ratio of the above equation (3) and the above equation (2), and is specifically represented by the following equation (5):

$$\text{Carrier Suppression} = 20\log\frac{2\sqrt{C^2+D^2}}{k(A+B)} \quad (5)$$

On the other hand, the image suppression ratio (Image suppression), as a ratio of the side-band leak level to the signal output level (Output level), is represented by the ratio of the above equation (4) and the above equation (2), and is specifically represented by the following equation (6):

$$\text{image Suppression} = 20\log\frac{A-B}{A+B} \quad (6)$$

If the amplitude of the IQ signal is k[V] and the d.c. offsets of I and Q are TXIOffset [V] and TXQOffset [V], respectively, the carrier suppression ratio is represented, from the above equation (5), in accordance with the following equation (7):

$$\text{Carrier Suppression} = \quad (7)$$

$$20\log\frac{2\sqrt{C^2+D^2}}{k(A+B)} =$$

$$20\log\left(\frac{2\sqrt{(TXI\ \text{Offset})^2+(TXQ\ \text{Offset})^2}}{k(A+B)}\right)[dBc]$$

Figure 5:
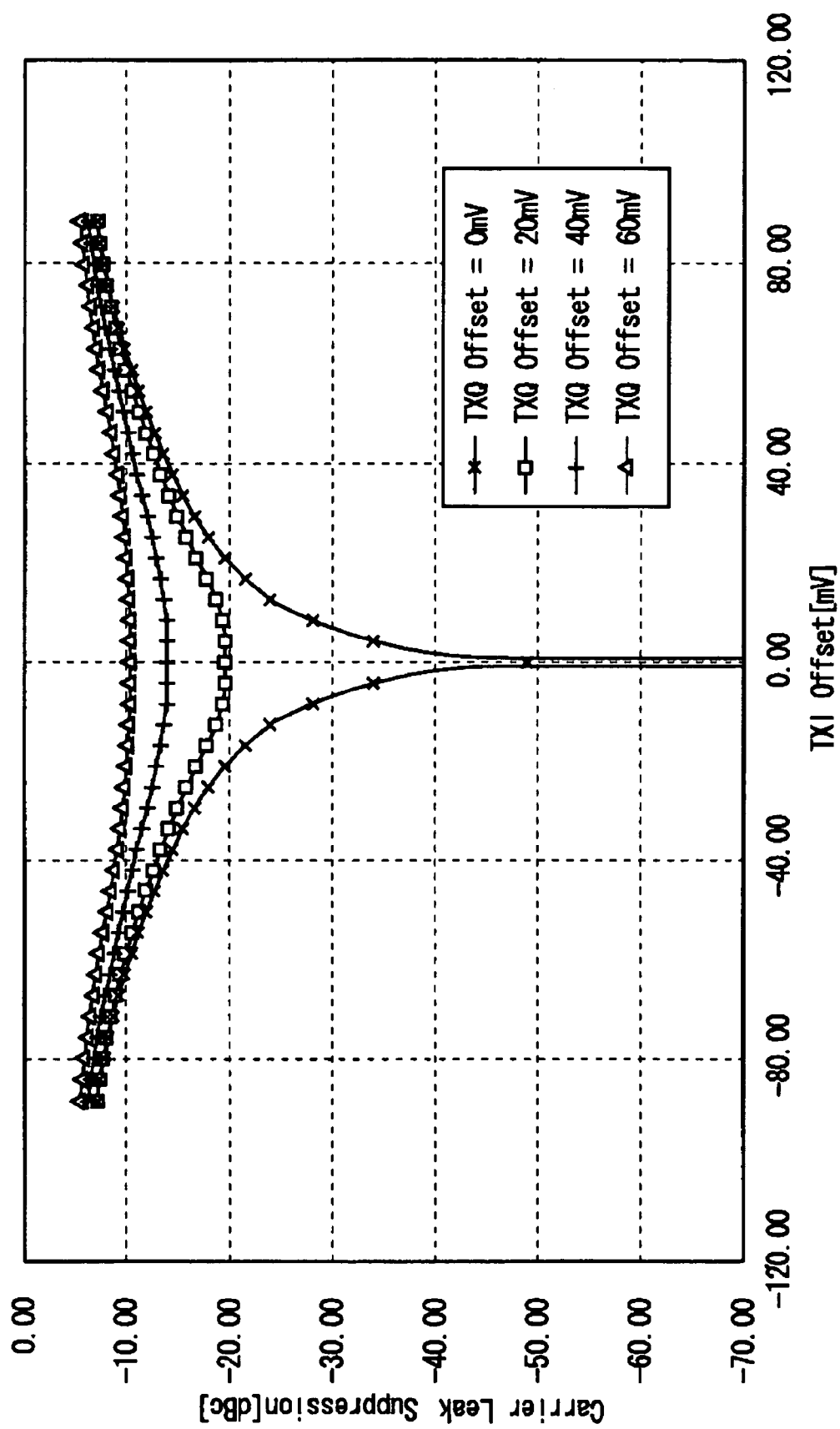
FIG. 5 shows theoretically calculated carrier suppression values in case TXQ offset values are fixed and TXI offset values are changed.

FIG. 5 shows theoretically calculated carrier suppression values in case the TXQ offset value (TXQOffset) is fixed and the TXI offset value (TXIOffset) is changed. The point where the TXQ offset value and the TXI offset value are 0 mV represents a point free from redundant residual offset, with the carrier suppression ratio being maximum.

Theoretically, from the above equation (7), the carrier suppression ratio component is −∞ at $C^2+D^2=0$ (see a point for TXI, TXQ=0mV of FIG. 5).

From the above equation (7), $\sqrt{(C^2+D^2)}$ denotes a circle in the rectangular coordinate system of C and D. This means that, if a plane having the TXI offset and the TXQ offset as the vertical and horizontal axes, respectively, the points indicating the equal magnitudes of the carrier suppression ratio are distributed on concentric circles, as shown in FIG. 6.

Figure 6:
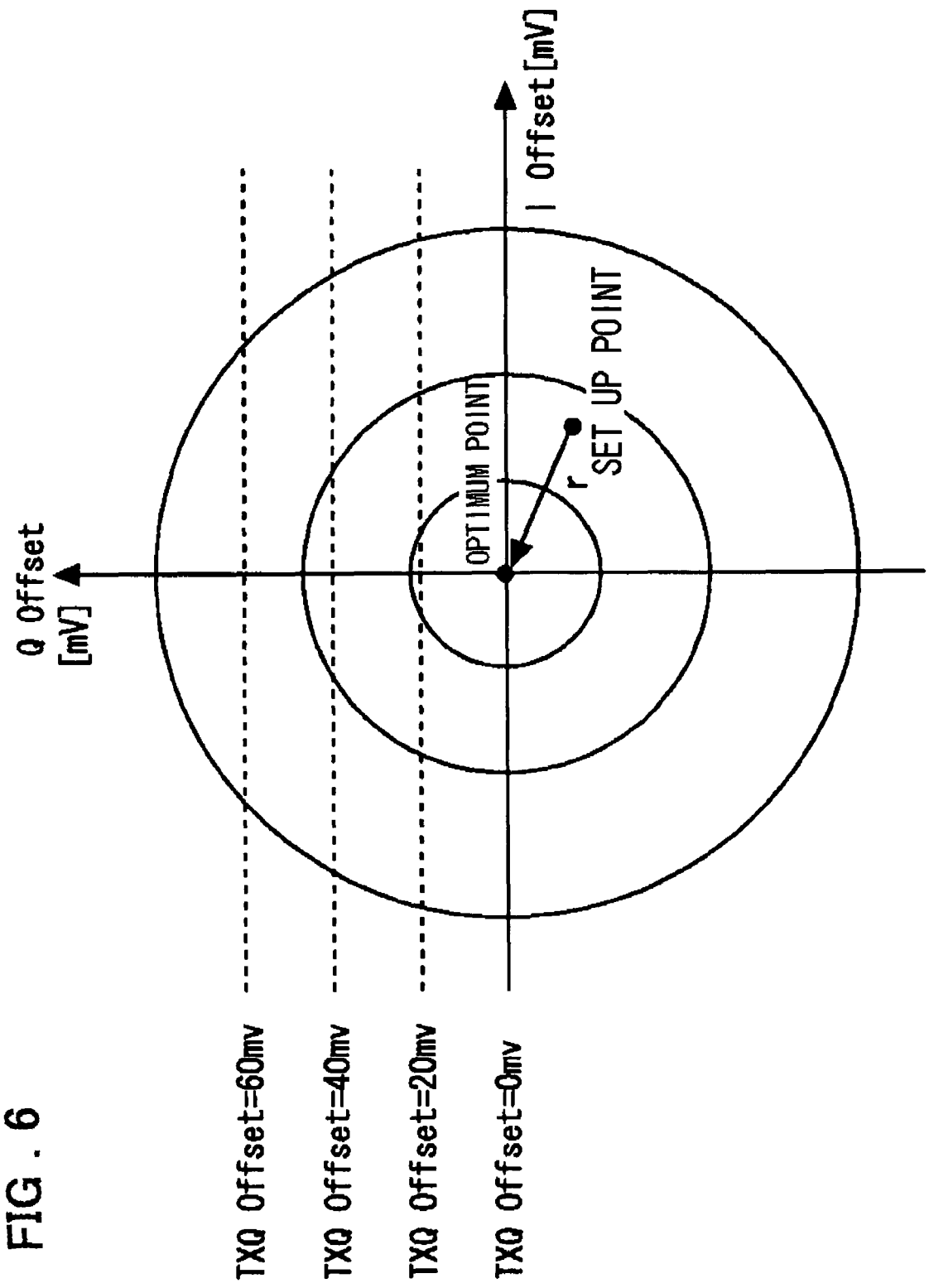
FIG. 6 shows a carrier suppression ratio in an offset coordinate plane.

The graph of FIG. 5 indicates the trajectories through the points of intersection of broken lines of FIG. 6 with the concentric circles in case the TXQ offset is fixed at a constant value and the TXI offset is changed.

Since the values of the carrier suppression ratio are distributed on concentric circles, with the optimum adjustment point as center, on an plane of the IQ offset correction values, the distance r from the current setting point to the optimum adjustment point may be found, from the value of the carrier suppression ratio, as shown in FIG. 6, in accordance with the following equation (8):

$$r=\sqrt{(TXI\text{Offset})^2+(TXQ\text{Offset})^2} \quad (8)$$

If an inverse function of the above equation (5) is found, r may be given by the following equation (9):

$$r = \frac{k(A+B)}{2}\cdot 10^{\frac{carrier\ Suppression\ [dBc]}{20}}\times 10^3 \quad (9)$$

where the unit of r is [mV].

With use of the above equation (9), the distance on the plane of the IQ offset correction values up to the optimum adjustment point may be calculated by measuring the carrier suppression ratio.

The estimation of the signal level in the present embodiment is now explained. From the above equation (2), the signal level may be found from G (gain), k (amplitude of the sine wave) and A, B (values of the I-gain and the Q-gain). Since the values of k, A and B are known pre-set values, the signal output level can be found if the value of the gain G can be found.

Figure 7:
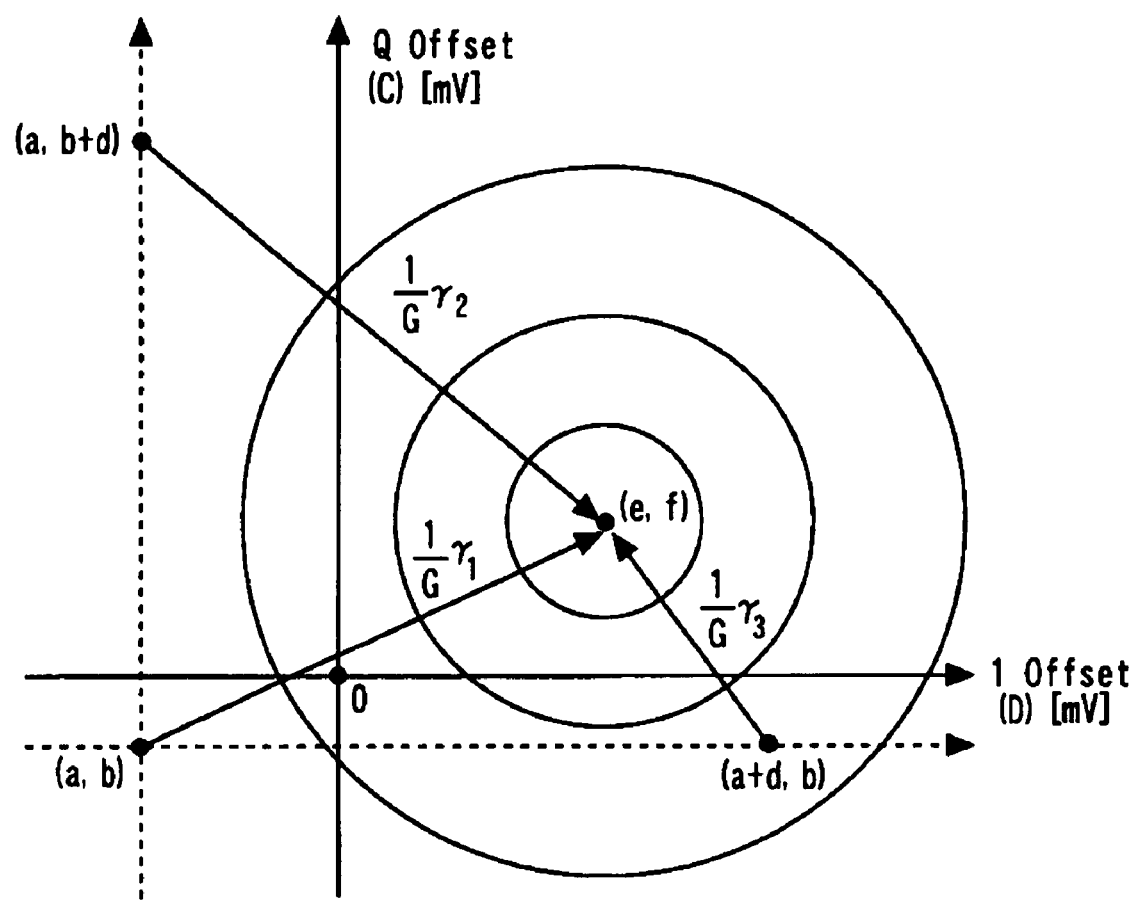
FIG. 7 shows an optimum point on a Plane of the IQ offset correction values.

Referring to FIG. 7, (e, f) denotes an optimum point of the IQ offset set-up value to be found on the plane of the IQ offset correction values. The values of the carrier suppression ratio are distributed concentrically about this optimum point (e, f) as the center.

From the above equation (4), the signal output level is a constant value. Hence, it may be said that the values of the carrier leak level of the above equation (3) are also distributed concentrically about this optimum point (e, f) as center. Each circle of FIG. 7 denotes the same carrier leak level.

In FIG. 7, the carrier leak levels for offsets of three points (a, b), (a+d, b) and (a, b+d) on the plane of the IQ offset correction values, are found. If $\sqrt{(C^2+D^2)}$ at this time is set to R, then R can be expressed, from the above equation (5), using the carrier leak level CL, in accordance with the following equation (10):

$$R = \sqrt{C^2+D^2} = \frac{1}{G}10^{\frac{CL}{20}} \quad (10)$$

Since $\sqrt{(C^2+D^2)}$ represents the distance between a point of measurement and the optimum point in FIG. 7, the following three equations (11):

$$(a-e)^2 + (b-f)^2 = \frac{1}{G^2}r_1^2$$
$$(a-e)^2 + (b+d-f)^2 = \frac{1}{G^2}r_2^2 \quad (11)$$
$$(a+d-e)^2 + (b-f)^2 = \frac{1}{G^2}r_3^2$$

may be derived from the three points of measurement, the distance to and the coordinate of the optimum point. For simplicity sake, $r_N = 10^{(CL/20)}$ is set, with r1 being a value at the point (a, b), r2 being a value at the point (a+d, b) and r3 being a value at the point (a, b+d).

Solving G of the above equation with respect to a, b, d, r1, r2 and r3, the following equation (12):

$$2d^4G^4 + [2d^2\{(r_1^2 - r_2^2) + (r_1^2 - r_3^2)\} - 4d^2r_1^2]G^2 + (r_1^2 - r_2^2)^2 + (r_1^2 - r_3^2)^2 = 0 \quad (12)$$

is derived.

The above is the four-degree equation of G and, since G>0, the gain G is given by the following equation (13):

$$G = \sqrt{\frac{-B + \sqrt{B^2 - 4AC}}{2A}} \quad (13)$$

where $$A = 2d^4$$
$$B = 2d^2\{(r_1^2 - r_2^2) + (r_1^2 - r_3^2)\} - 4d^2r_1^2 \quad (14)$$
$$C = (r_1^2 - r_2^2)^2 + (r_1^2 - r_3^2)^2$$

The signal output level (Output level) may be calculated by substituting G, derived by the above equation (13), into the equation (2).

That is, with the present embodiment, the signal output level may be calculated only from the absolute values of the carrier leak level of three points to calculate the carrier suppression ratio, without the necessity of directly calculating the signal output level.

The carrier suppression ratio of the three points may be found from the absolute values of the carrier leak level of the three points, and the distance up to the optimum adjustment point may be found from the carrier suppression ratio.

By the distance up to the adjustment point as found, and the coordinates of the point of measurement on the plane of correction of the IQ offset of the point of measurement, a circle is drawn with the distance up to the adjustment point as a radius, with the point of measurement as the center. If this circle is drawn for each of the three points measured, the resulting three circles intersect one another geometrically at a sole point. This point of intersection represents an optimum adjustment point of the offsets to be found.

Figure 8:
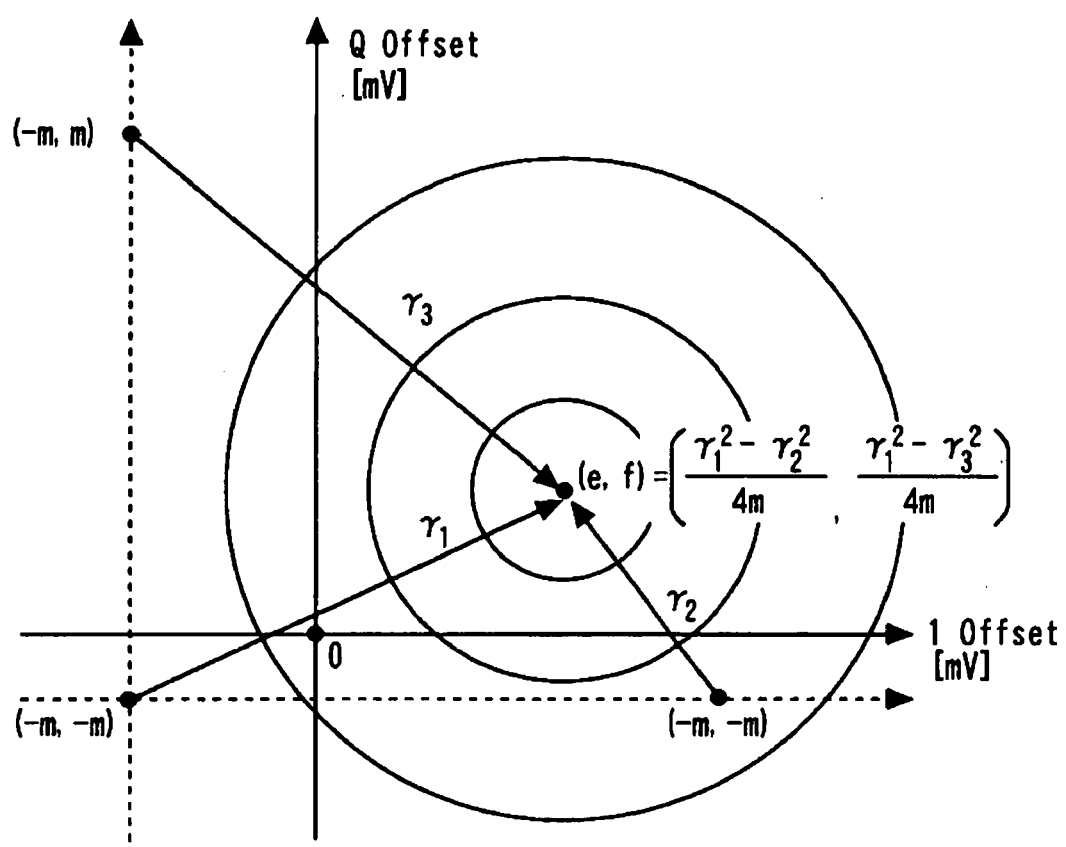
FIG. 8 illustrates deduction of an optimum IQ offset value through measurement of an absolute value of a three-point carrier leak level according to the embodiment of the present invention.

When the carrier leak levels for three points of (−m, −m), (−m, m), (m, −m) are measured on the plane of correction of the IQ offset, the result is as shown in FIG. 8, and the equations of circles for the three points are as indicated by the following equation (15):

$$(x+m)^2 + (y+m)^2 = r_1^2$$
$$(x-m)^2 + (y+m)^2 = r_2^2$$
$$(x+m)^2 + (y-m)^2 = r_3^2 \quad (15)$$

By solving the equations (15), the target convergence point (e, f), representing the optimum set-up value of the IQ offsets, may be found as indicated by the following equation (16):

$$(e, f) = \left(\frac{r_1^2 - r_2^2}{4m}, \frac{r_1^2 - r_3^2}{4m}\right) \quad (16)$$

The foregoing indicates that the optimum IQ offset values may be detected by measuring the absolute values of the carrier leak level of the three points.

Meanwhile, if, in measuring the absolute values of the carrier leak level of the three points, measurement is carried out as the IQ offsets are changed from one point to the next, the setting and the writing of the IQ offset values become time-consuming.

Hence, in the present embodiment, such a scheme is provided in the hardware circuit for enabling plural IQ offset values to be set at each preset time interval, so that values of the three points of the carrier leak are found at a time to enable adjustment in a short time to reduce the adjustment time significantly. The time interval (timing interval) for varying the IQ offset values may be changed as desired.

Figure 9A:
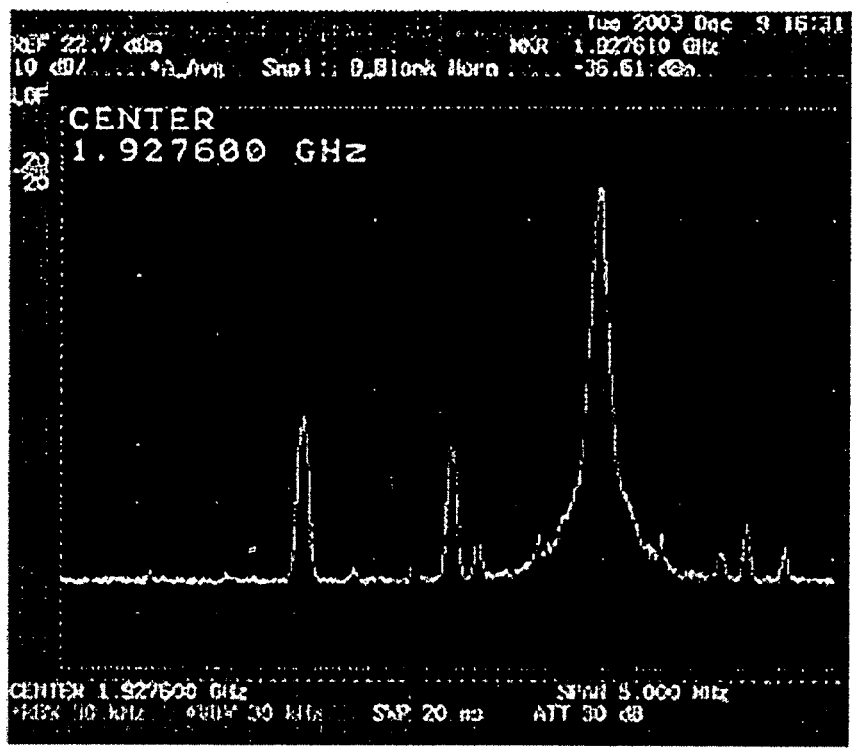
FIGS. 9A and 9B illustrate a zero span measurement image surface in a spectrum analyzer according to the embodiment of the present invention.
Figure 9B:
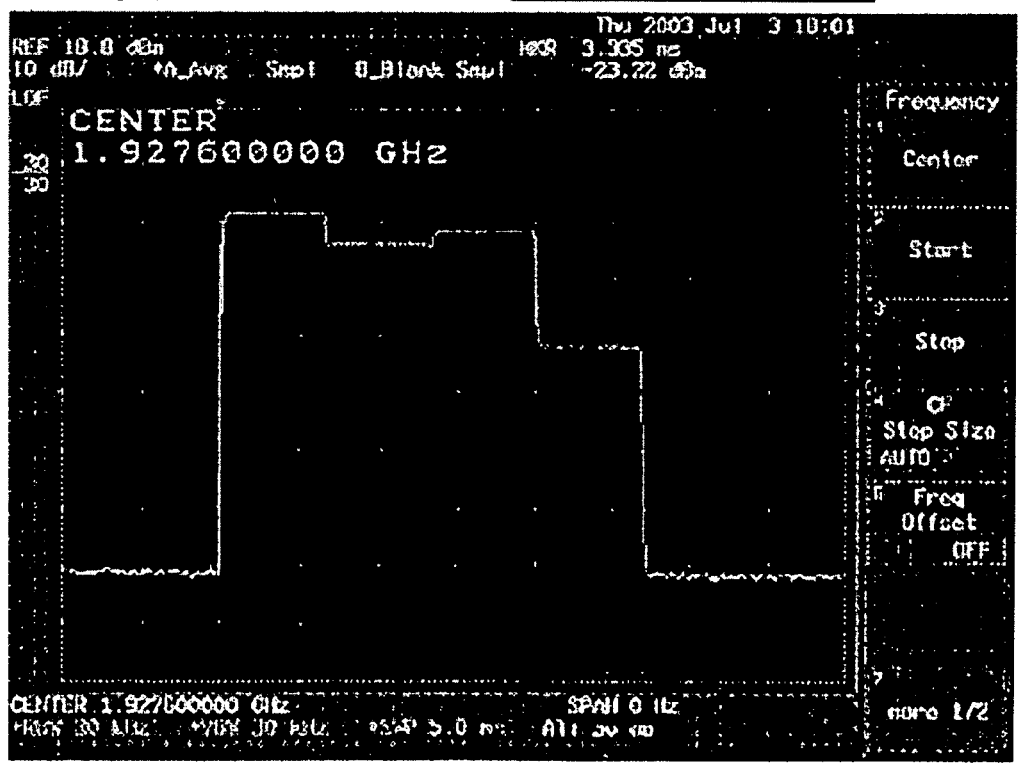

In the present embodiment, the carrier leak values for the values of the IQ offsets, as set at a preset time interval, may be measured at a time by carrying out the measurement in the zero span mode of a spectrum analyzer (heterodyning system)(see FIGS. 9A and 9B). That is, in the present embodiment, IQ adjustment may be made by a sole measurement operation by the spectrum analyzer, thereby shortening the IQ adjustment time.

In the present embodiment, the d.c. IQ offset values, generated in the output of the analog baseband unit 11 and in the input of the quadrature modulator 10, in FIG. 1, due to manufacture tolerances, are canceled out by the IQ offset values as set in the analog baseband unit 11, while the IQ amplitudes are adjusted by the IQ gain values.

Figure 10:
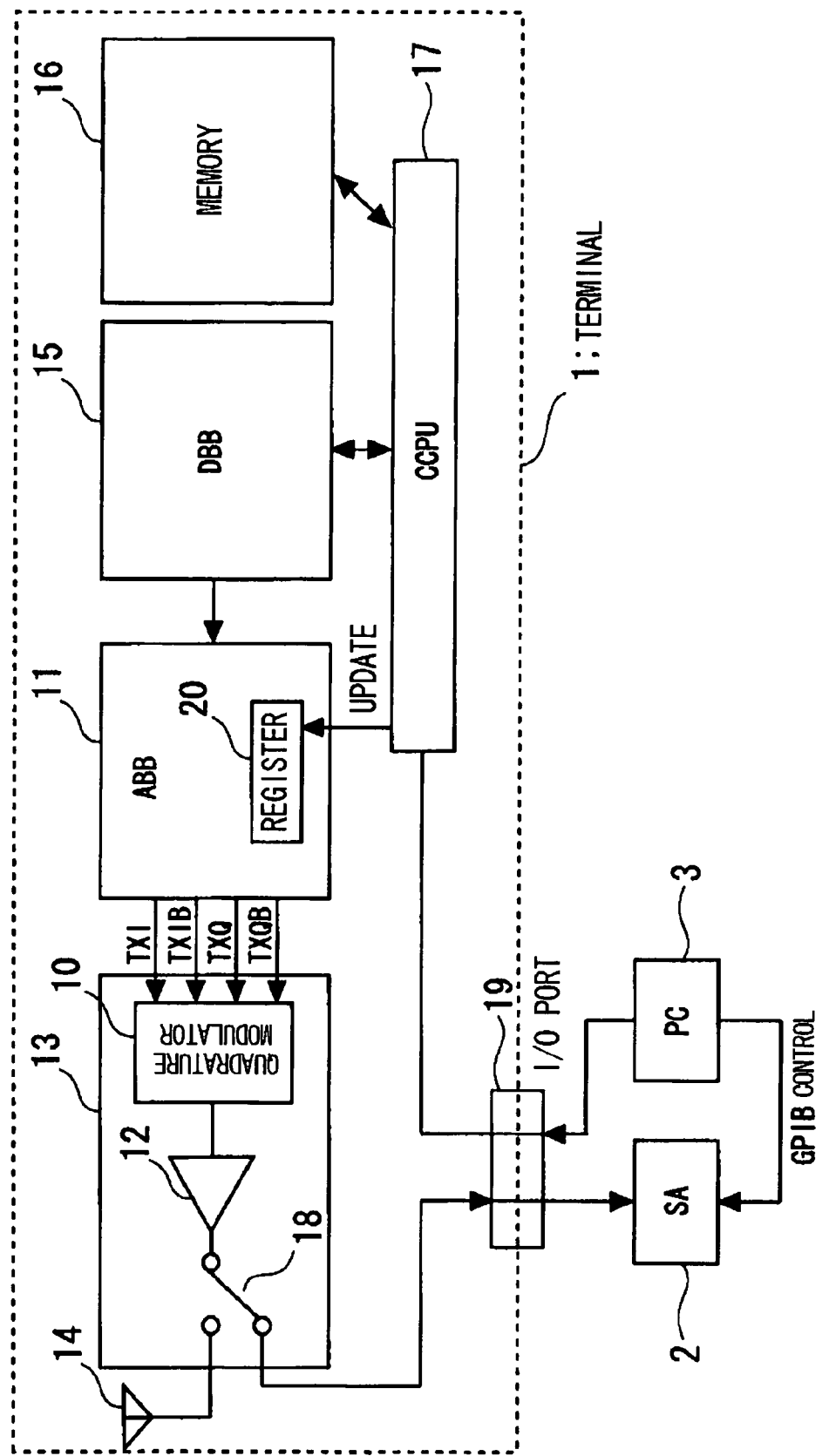
FIG. 10 is a diagram showing a system configuration of a measurement apparatus and a communication terminal according to the embodiment of the present invention.

FIG. 10 shows an arrangement of a measurement system of an embodiment of the present invention. Referring to FIG. 10, a terminal 1, such as a mobile phone terminal, forming an apparatus being measured, includes a quadrature modulator 10, a wireless (RF) unit 13, formed by an amplifier 12, an antenna 14, an analog baseband unit (ABB) 11, a digital baseband unit (DBB) 15, a control computer (CCPU) 17 in the terminal 1, a memory 16 and an I/O port 19. The terminal 1 also includes a changeover switch 18 for switching the output of the amplifier 12 to an output terminal of the I/O port 19. The digital baseband unit (DBB) 15 converts a sequence of serial data into parallel data and generates a baseband signal for a set of parallel data. The digital baseband unit also generates a preset test signal, such as a sine wave, during testing. The analog baseband unit (ABB) 11 converts the baseband signal from the digital baseband unit (DBB) 15 into analog signals (I and Q signals) which are output to the quadrature modulator 10. An output terminal (co-axial cable terminal) of the I/O port 19 is connected by a co-axial cable to an input of a spectrum analyzer (SA) 2 controlled by a personal computer (PC) 3 to which the SA is connected by e.g.

GPIB (general purpose interface bus). An output (e.g. an IQ offset set-up value or test start command) from a computer (data processing apparatus) 3, such as a personal computer, is entered from an input terminal of the I/O port 19 to the computer 17. As for the IQ offset values and the IQ gain values, the offset and the gain of the analog baseband unit 12 are set in the register 20, by the test start command, issued by the computer 3, in accordance with the set-up timing. The digital baseband unit 15 generates, by a digital signal processor, not shown, a sine wave and a cosine wave, as I and Q components. The analog baseband unit 11 sends the IQ offset, as set in a register 20, and differential signals (TXI, TXIB, and TXQ, TXQB), reflecting the IQ gain values, to the quadrature modulator 10 of the RF unit 13. An output of the RF unit 13 is output from the I/O port 19 via changeover switch 18. This output signal is measured by the spectrum analyzer 2 (zero span mode) and a measured value by the spectrum analyzer 2 is automatically read by the computer 3 over e.g. the GPIB bus to find an optimum IQ offset (or, the IQ offset and the IQ gain). The optimum IQ offset or the optimum IQ gain, as found by the computer 3, is transmitted over the I/O port 19 to the computer (CCPU) 17 and set in the register 20 of the analog baseband unit. The gain G of the above equation (1) corresponds to the gain in the RF unit 13 of FIG. 10. In the example shown in FIG. 10, the output of the changeover switch 18 (output of the amplifier 12) is measured by the spectrum analyzer 2. However, the output signal of the quadrature modulator 10 may also be measured by the spectrum analyzer 2.

In the present embodiment, the processing of deriving the IQ offset adjustment values in the personal computer (PC) 3, the setting control of the IQ offset set-up value to the analog baseband unit 11 and the readout processing of reading out the measured values from the spectrum analyzer 2 over the GPIB bus may be carried out by a program run on the computer 3, and read by the computer from a computer-readable storage medium, such as a Hard Drive, RAM and/or CD/ROM, or the like.

Figure 11:
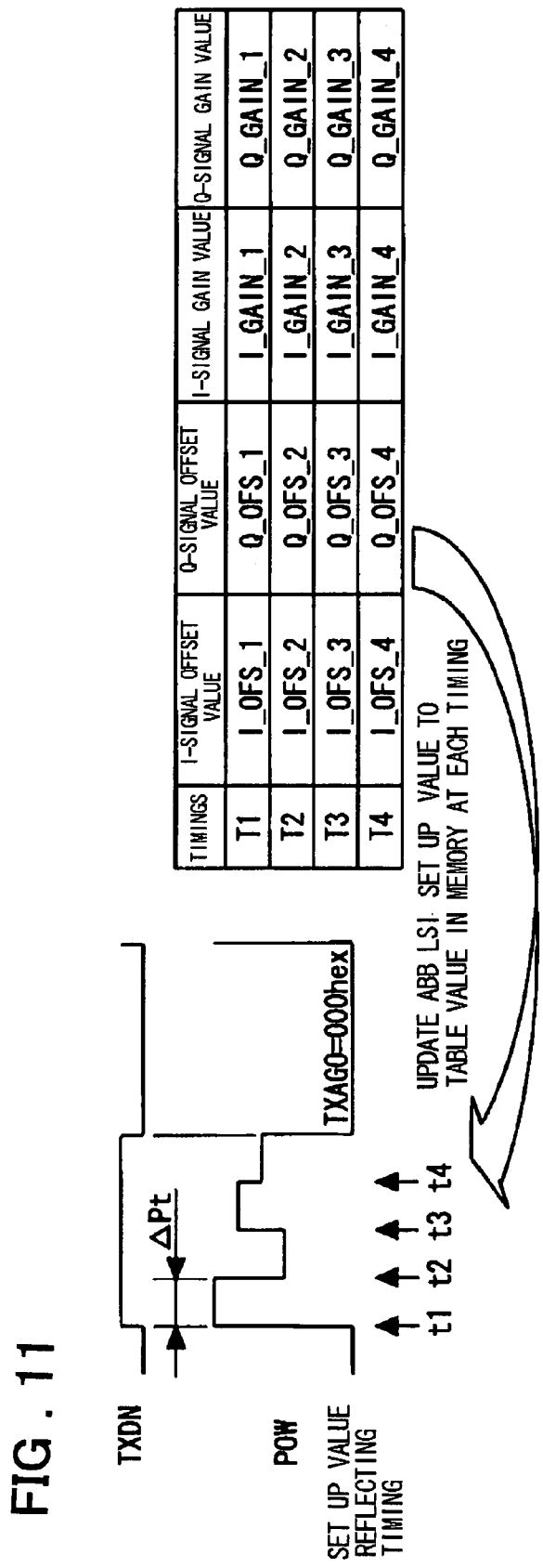
FIG. 11 illustrates the processing sequence for gain adjustment in an alternative embodiment of the present invention.

FIG. 11 schematically illustrates the operation of an embodiment of the present invention, and specifically illustrates the setting at a preset timing interval of the IQ offset and the IQ gain for the analog baseband unit 11. Referring to FIG. 11, the IQ offset values and the IQ gain values are set, at a timing tn, in the analog baseband unit 11, at as preset time interval $\Delta$ Pt. The IQ offset values and the IQ gain values for respective set-up timings are supplied from the computer (CCPU) 17 to the analog baseband unit (ABB LSI) 11 of the terminal 1. The IQ offset values and the IQ gain values for the respective set-up timings are stored in the register 20 of the analog baseband unit 11 in the form of a table shown in FIG. 11. The analog baseband unit 11 (see FIG. 10) sets the offset and the gain, to be stored in the register 20, at timings T1, T2, T3 and T4, for an output circuit of the variable gain type, not shown, adapted for outputting the I and Q signals, under control by the computer 17 (see FIG. 10). This output circuit of the analog baseband unit 11, provided with an offset adder, sums or subtracts the d.c. offset of the output IQ signals, depending on the positive or the negative sign of the IQ offset, respectively. By reflecting the IQ offset and the IQ gain, as set for each set-up timing tn, in this manner, the carrier leak values, attendant on the set-up values, are output from the RF unit 13 of the terminal. 1 (see FIG. 10).

The waveform of the carrier leak in the output signal of the RF unit 13 of FIG. 10 may be measured at a time by the zero span mode of the spectrum analyzer 2. By setting the center frequency of the spectrum analyzer 2 to the carrier leak frequency, and by setting the span to 0 (fixed tuning), the carrier leak level of the offset values as set at the respective timings may be measured as stepped waveform in the time domain of the carrier leak level, as shown in FIG. 11. That is, measured data of the carrier leak levels in the spectrum analyzer 2 (see FIG. 10) at the respective set-up timings t1, t2, t3 or t4 are transmitted to the computer 3 where the optimum IQ offset set-up values are found from the absolute values of the carrier leak level at the three points in accordance with the algorithm described above.

It is noted that the time interval of $\Delta$ Pt and the number of the IQ offset gain values tn as set may be changed optionally, and that, by such change, it is possible to realize desired step widths and the desired number of steps for the carrier leak level POW of FIG. 11 (level transition in the time domain).

A modification of the present invention is now explained. The present modification envisages adjusting the IQ gain. As in the previous embodiment, in which the carrier leak value is measured for adjusting the IQ offset, the IQ gain set-up value, as set in the analog baseband unit 11 (see FIG. 1), is reflected in the output signal to measure the side-band leak and to adjust the IQ gain value. In this case, the side-band leak level of the offset value is measured by the spectrum analyzer.

Figure 12:
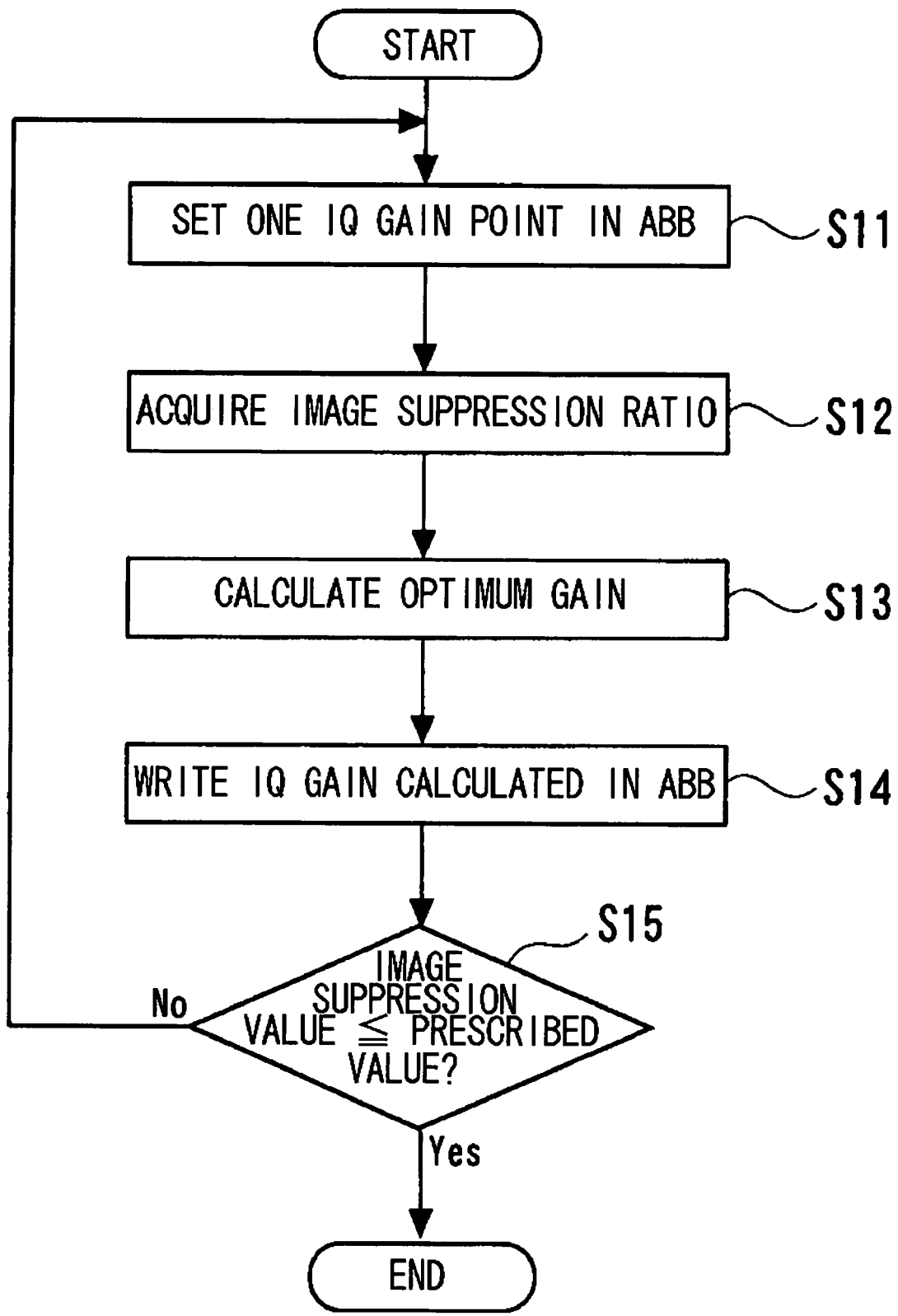
FIG. 12 shows the processing sequence for gain adjustment according to the alternative embodiment of the present invention.

FIG. 12 depicts a flowchart for illustrating the sequence of operations for gain adjustment according to the modification of the present invention. Meanwhile, the configuration of the gain adjustment according to the present invention is similar to the configuration shown in FIG. 10. However, in the spectrum analyzer, the spectrum analyzer performs frequency sweeping, instead of fixed tuning (zero span mode), such that the measured values of the side-band leak level and the signal output of FIG. 4 are output to the computer 3. The computer 3 finds an optimum gain value and sets the gain value thus found in the terminal 1. Referring to FIGS. 10 and 12, the processing sequence of the second embodiment of the present invention is now explained.

The computer 3 sets a set of gain set-up values of the I-signal and the Q-signals in the analog baseband unit 11 (step S11).

The spectrum analyzer 2, having an output signal from the quadrature modulator 10 of the RF unit 13 as an input, measures an output signal level (Output level) (see FIG. 4), and a side-band leak level (Sideband leak level), and routes the measured value to the computer 3. This computer then finds the image suppression ratio which is the side-band leak level with respect to the output signal level (Output level) (step S12).

The computer 3 then deduces optimum values of the I-gain and the Q-gain, form the image suppression ratio, in accordance with the technique as now explained.

The computer 3 then sets optimum values of the I-gain and the Q-gain, thus deduced, in the analog baseband unit 11 (step S14).

If, as a result of measurement in the spectrum analyzer 2, the image suppression ratio is less than or equal to a prescribed value, the adjustment is terminated. If otherwise, processing transfers to a step S11, where another set-up value of the IQ gain is set in the analog baseband unit 11. In the present embodiment, deduction of the optimum values of the I-gain and the Q-gain in the computer (PC) 3, setting of the IC gain set-up values in the analog baseband unit 11 and readout of the measured value from the spectrum analyzer 2, are carried out in accordance with a program run on the computer 3.

Figure 13A:
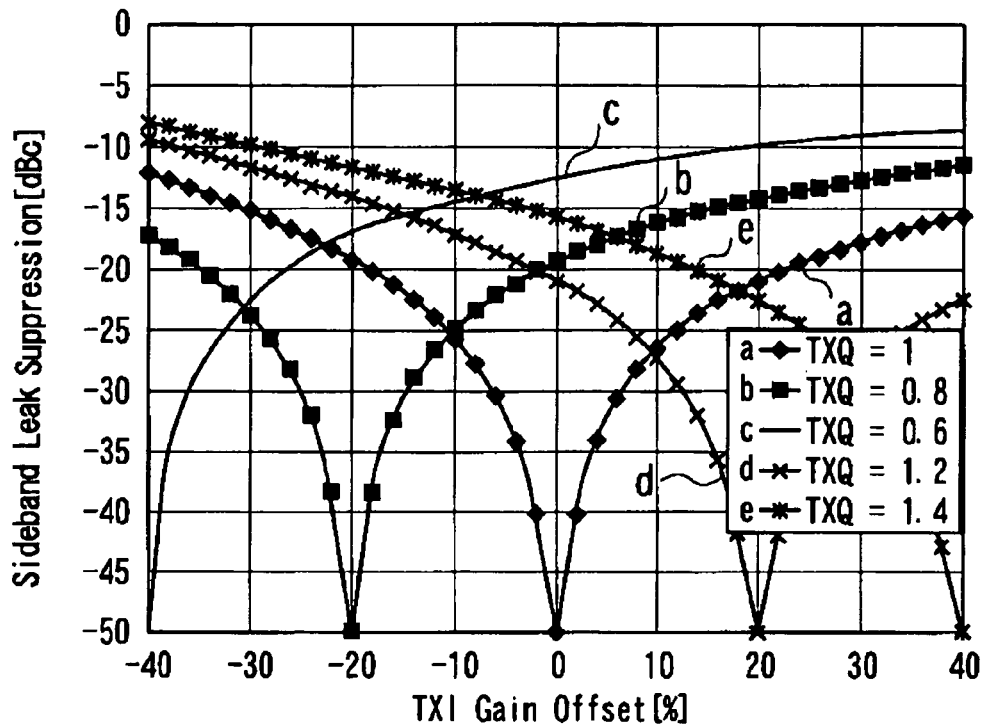
FIG. 13A shows theoretical values of side-band leak suppression (image suppression ratio) in case the TXQ gain is fixed and the TXI gain is changed and FIG. 13B shows the theoretical values on a TXIQ gain plane having A and B for the constant IS ratio as x-axis and y-axis, respectively.

FIG. 13A shows theoretical values of the side-band leak suppression (image suppression ratio) in case the TXQ gain is fixed and the TXI gain is changed.

From the image suppression (IS) ratio of the above equation (6), the gain B (amplitude component) of the Q-signal and the gain A (amplitude component) of the I-signal may be represented by the following equation (17):

$$IS\,ratio = 20\log\frac{A-B}{A+B}[dBc] \Leftrightarrow \qquad (17)$$

$$\frac{A-B}{A+B} = 10^{\frac{IS\,ratio}{20}} \Leftrightarrow$$

$$B = \frac{1-10^{\frac{IS\,ratio}{20}}}{1+10^{\frac{IS\,ratio}{20}}}A$$

$$= kA$$

Figure 13B:
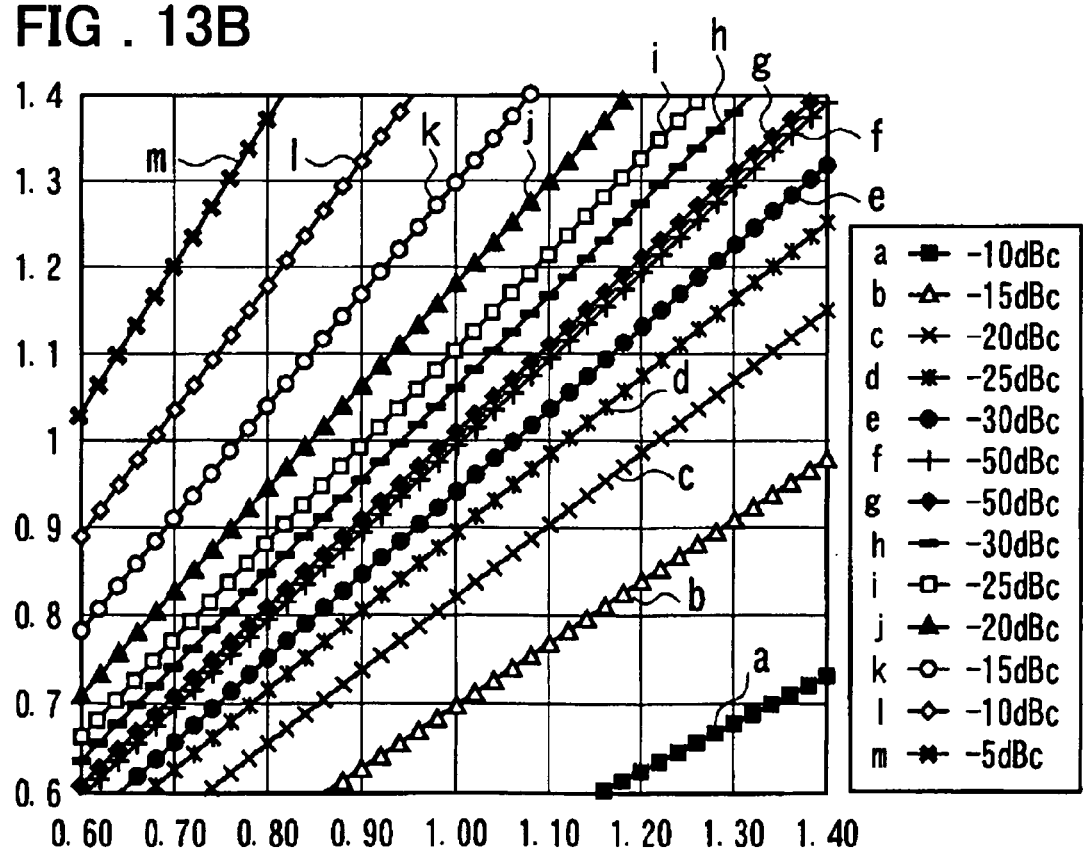

FIG. 13B shows the TXIQ gain plane in which the gain A and the gain B for constant values of the respective IS ratio are plotted on an x-axis and on a y-axis, respectively.

Figure 14:
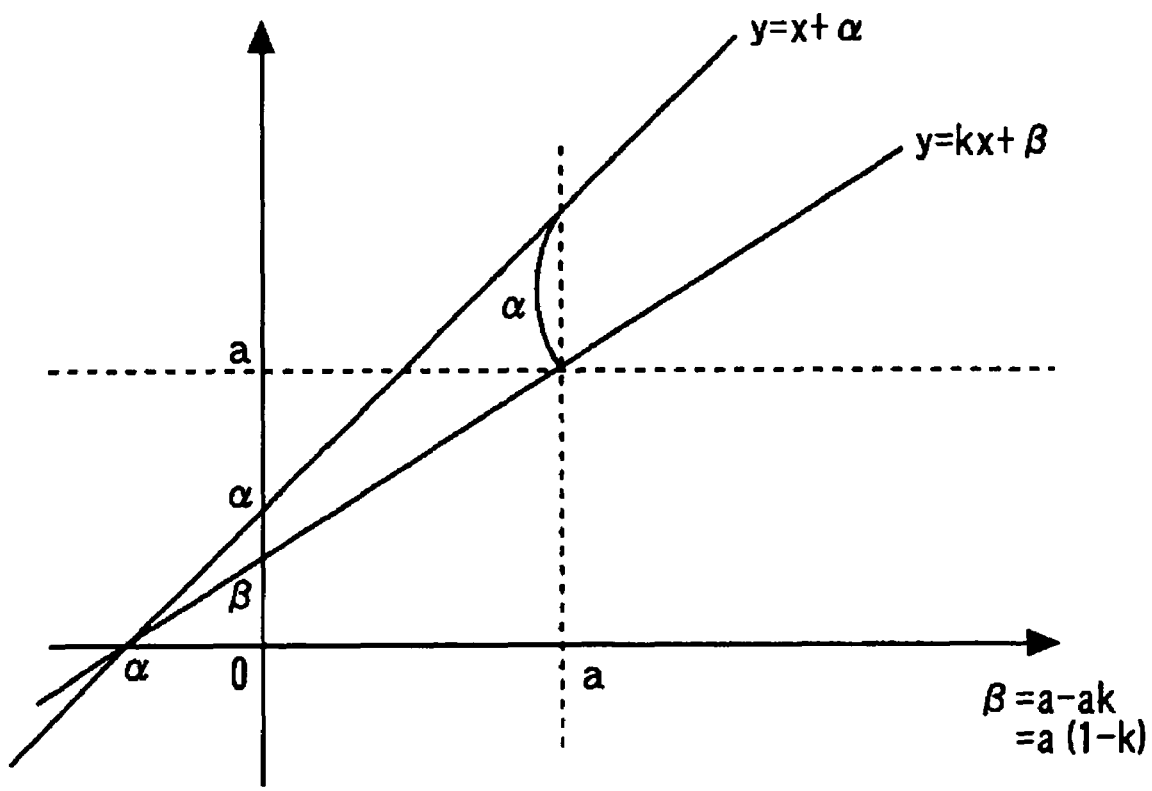
FIG. 14 illustrates deduction of an optimum gain in the alternative embodiment of the present invention.

FIG. 14 shows two constant-IS-ratio characteristics ($y=x+\alpha$ and $y=kx+\beta$) on the TXIQ gain plane of FIG. 13B. Referring to FIG. 14, the deduction of the optimum gain is explained. For the IS ratio=∞, 10^ (IS ratio/20)=0, where an operator ^ denotes a power. The coefficient k of B=kA of the above equation (17) is 1.

In FIG. 14, from $$\alpha:(\alpha-\beta)=(a+\alpha):\alpha,$$

$$\alpha^2=(\alpha-\beta)\cdot(a+\alpha) \qquad (18)$$

in which α is represented by the following equation (19):

$$\alpha = \frac{\beta a}{a-\beta} \qquad (19)$$

$$= \frac{a^2(1-k)}{a-a+ak} = \frac{a(1-k)}{k}$$

Thus, on the coordinate of FIG. 14, the optimum gain point is given by the following equation (20):

$$\left(a, a+\frac{a(1-k)}{k}\right) \qquad (20)$$

Although the present invention has so far been explained with reference to certain preferred embodiments, it is to be noted that the present invention is not limited to these specified embodiments and may comprise various changes or corrections that may be envisaged by those skilled in the art within the scope of the invention.

The apparatus and the method for adjusting the offset and the gain according to the present invention may conveniently be applied not only to manufacture tests but also to adjustment in product shipment.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for deriving, by a computer, optimum adjustment values of an offset (I-offset) of an in-phase signal (I-signal) and an offset (Q-offset) of a quadrature signal (Q-signal) in a quadrature modulator, which is configured for quadrature modulating a carrier signal with said I-signal and with said Q-signal, output from a baseband unit, and for outputting the quadrature modulated carrier, said method comprising the steps of:

said computer inputting measured values of a carrier leak level of an output of said quadrature modulator, supplied with said I-signal and the Q-signal, output from said baseband unit, for each of at least three respective different sets of set-up values of the I-offset and the Q-offset, as selected on a two-dimensional coordinate plane having I-components and Q-components as X and Y coordinates, respectively; and said computer calculating corresponding values of a carrier suppression ratio from measured values of the carrier leak level of the three sets of the set-up values of the I-offset and the Q-offset to derive optimum adjustment values of the I-offset and the Q-offset.

2. The method according to claim 1, further comprising the steps of:

said computer finding values of the corresponding carrier suppression ratio from measured values of the carrier leak level of said three sets, and finding the distance up to an optimum adjustment point of said I-offset and Q-offset on said two-dimensional coordinate plane from said carrier suppression ratio; and said computer finding a point of intersection of three circles on said two-dimensional coordinate plane, said circles having the set-up values of said I-offset and the Q-offset as centers and having the distances up to said optimum adjustment point as radii, for deriving an optimum adjustment point of the I-offset and the Q-offset.

3. The method as claimed in claim 1, wherein said three sets of the set-up values of the I-offset and the Q-offset are (−m, −m), (−m, m) and (m, −m); and wherein said computer, of the output signal from said quadrature modulator, supplied with the I-signal and the Q-signal, associated with respective set-up values from said baseband unit, finds a sole point of intersection of three circles on said two-dimensional coordinate plane, said circles having the set-up values of said I-offset and the Q-offset as centers and having, as radii, the values prescribed by absolute values of the carrier leak level associated with the set-up values of the offsets, to obtain the distance up to an optimum adjustment point of said I-offset and the Q-offset.

4. The method according to claim 1, further comprising a step of setting the optimum adjustment values of the I-offset and the Q-offset derived in said baseband unit under control by said computer.

5. The method according to claim 1, further comprising a step of acquiring measured values of three carrier leak level, associated with said three sets of set-up values of the I-offset and the Q-offset, from output signals of said quadrature modulator associated with set-up values of said three sets of said I-offset and the Q-offset, by at least one measurement on a frequency analyzer.

6. An offset adjustment device for adjusting an offset (I-offset) of an in-phase signal (I-signal) and an offset (Q-offset) of a quadrature signal (Q-signal) in a communication apparatus comprising:

a baseband unit for outputting the I-signal and the Q-signal; and a quadrature modulator including;

a phase shifter for phase shifting a carrier by 90°;

first and second mixer receiving the I-signal and the Q-signal output from said baseband unit respectively and multiplying the I-signal and the Q-signal with said carrier and with an output of said phase shifter respectively; and an adder for summing the results of multiplication of said first and second mixers to output an output signal; said offset adjustment device comprising;

a measurement unit; and a data processing unit for controlling said measurement unit and said communication apparatus;

wherein said data processing unit sets, for said baseband unit of said communication apparatus, at least three respective different sets of set-up values of the I-offset and the Q-offset, on a two-dimensional coordinate plane having the I-component and the Q-component as X-coordinate and Y-coordinates, respectively, at respective different set-up timings;

wherein said measurement unit acquires carrier leak levels associated with said three sets of offset set-up values, by one measurement from an output signal of said quadrature modulator; and wherein said data processing unit is supplied with measured values of three sets of the carrier leak level obtained by said measurement unit to find three sets of the carrier suppression ratio to find optimum adjustment values of the I-offset and the Q-offset.

7. The offset adjustment device according to claim 6, wherein said data processing unit includes means for finding the corresponding values of the carrier suppression ratio from measured values of the three sets of the carrier leak level, finding the distance up to the optimum adjustment point of said I-offset and the Q-offset on said two-dimensional coordinate plane from said carrier suppression ratio, and finding a point of intersection of three circles on said two-dimensional coordinate plane, said circles having the set-up values of said I-offset and the Q-offset as centers and having the distances up to said optimum adjustment point as radii, for deriving an optimum adjustment value of said I-offset and the Q-offset.

8. The offset adjustment device according to claim 6, wherein said data processing includes means for finding the corresponding values of the carrier suppression ratio from measured values of the three sets of the carrier leak level, finding a distance up to the optimum adjustment point of said I-offset and the Q-offset on said two-dimensional coordinate plane from said carrier suppression ratio, and finds a point of intersection of three circles on said two-dimensional coordinate plane, said circles having the set-up values of said I-offset and the Q-offset as centers and having the distances up to said optimum adjustment point as radii, for deriving an optimum adjustment value of said I-offset and the Q-offset.

9. The offset adjustment device according to claim 6, further comprising means for finding a sole point of intersection of three circles on said two-dimensional coordinate plane, said circles having the set-up values of said I-offset and the Q-offset as centers and having, as radii, the values prescribed by absolute values of the carrier leak level associated with the set-up values of the offsets $(=(1/G)10(CL/20)$ where G is a gain), of the output signal from said quadrature modulator, supplied with the I-signal and the Q-signal, associated with said three sets of the set-up values of the I-offset and the Q-offset, to find the distance up to an optimum adjustment point of said I-offset and the Q-offset.

10. The offset adjustment device according to claim 6, wherein said three sets of the set-up values of the I-offset and the Q-offset are $(-m, -m)$, $(-m, m)$, and $(m, -m)$, said offset adjustment device further comprising finding a sole point of intersection of three circles on said two-dimensional coordinate plane, said circles having the set-up values of said I-offset and the Q-offset as centers and having, as radii, the values prescribed by absolute values of the carrier leak level associated with the set-up values of the offsets, of the output signal from said quadrature modulator, supplied with the I-signal and the Q-signal, associated with respective set-up values from said baseband unit, to find a distance up to an optimum adjustment point of said I-offset and the Q-offset.

11. The offset adjustment device according to claim 6, wherein said data processing unit includes means for setting optimum adjustment values of the I-offset and the Q-offset derived in said baseband unit.

12. The offset adjustment device according to claim 6, wherein said measurement unit includes a frequency analyzer for acquiring three measured values of the carrier leak level associated with said three points of the offset set-up values, by a sole measurement operation, from output signals of said quadrature modulator associated with said three sets of the offset set-up values.

13. A computer-readable storage medium storing a computer program for causing a computer to execute a method of adjustment of an offset in an I-signal (I-offset) and an offset in a Q-signal (Q-offset) of a quadrature signal (Q-signal) of a quadrature modulator which is configured for quadrature modulating a carrier with said I-signal and with said Q-signal, output from a baseband unit, and for outputting the modulated signal, said computer program executed on said computer comprising:

setting, on said baseband unit, at least three sets of respective different set-up values of the I-offset and the Q-offset, as selected on a two-dimensional coordinate plane having an I-component and a Q-component as X and Y coordinates, respectively;

reading out measured values of a measurement device configured for measuring the carrier leak level output from said quadrature modulator supplied with the I-signal and with the Q-signal output from said baseband unit where said three sets of the set-up values of the I-offset and the Q-offset are set; and finding corresponding values of the carrier suppression ratio from the measured values of the carrier leak level associated with the three sets of the I-offset and the Q-offset to derive optimum adjustment values of the I-offset and the Q-offset.

14. The computer-readable storage medium according to claim 13, for executing on said computer, the processing of finding a signal output level from absolute values of the carrier leak level for said three sets of the set-up values of the I-offset and the Q-offset, and wherein the values of the carrier suppression ratio for the respective sets are found to derive optimum adjustment values of the I and Q offsets.

15. The computer-readable storage medium according to claim 13, wherein the computer program executed on said computer comprises:

finding a value of the corresponding carrier suppression ratio from measured values of the carrier leak level of said three sets and finding the distance up to an optimum adjustment point of said I-offset and Q-offset on said two-dimensional coordinate plane from said carrier suppression ratio; and finding a point of intersection of three circles on said two-dimensional coordinate plane, said circles having the set-up values of said I-offset and the Q-offset as centers and having the distances up to said optimum adjustment point as radii, for deriving an optimum adjustment point of said I-offset and the Q-offset.

16. The computer-readable storage medium according to claim 13, for executing, on said computer, finding, a sole point of intersection of three circles on said two-dimensional coordinate plane, said circles having the set-up values of said I-offset and the Q-offset as centers and having, as radii, the values prescribed by absolute values of the carrier leak level associated with the set-up values of the offsets (=(1/G)10(CL/20) where G is a gain), of the output signal from said quadrature modulator, supplied with the I-signal and the Q-signal, associated with said three sets of the set-up values of the I-offset and the Q-offset, to find the distance up to an optimum adjustment point of said I-offset and the Q-offset.

17. The computer-readable storage medium according to claim 13, for executing, on said computer, finding a sole point of intersection of three circles on said two-dimensional coordinate plane, said circles having the set-up values of said I-offset and the Q-offset as centers and having, as radii, the values prescribed by absolute values of the carrier leak level corresponding to the set-up values of the offsets, of the output signal from said quadrature modulator, supplied with the I-signal and the Q-signal, associated with respective set-up values from said baseband unit, with said three sets of the set-up values of the I-offset and the Q-offset being (−m, −m), (−m, m), and (m, −m), to find the distance up to an optimum adjustment point of said I-offset and the Q-offset.

18. The computer-readable storage medium according to claim 13, for executing, on said computer, setting on said baseband unit of the optimum adjustment value of the I-offset and the Q-offset derived.

19. The computer-readable storage medium according to claim 13, wherein the center frequency of a frequency analyzer is of fixed tuning set to the carrier leak; said program allowing said computer to execute the processing of acquiring three measured values of the carrier peak level associated with said three sets of the offset set-up values in said frequency analyzer from output signals from said quadrature modulator associated with the three sets of the offset set-up values.

* * * * *